(12) United States Patent
Sasaki

(10) Patent No.: US 7,259,644 B2
(45) Date of Patent: Aug. 21, 2007

(54) SUBSTRATE HAVING MICROSTRIP LINE STRUCTURE, SEMICONDUCTOR DEVICE HAVING MICROSTRIP LINE STRUCTURE, AND MANUFACTURING METHOD OF SUBSTRATE HAVING MICROSTRIP LINE STRUCTURE

(75) Inventor: Naoto Sasaki, Kanagawa (JP)

(73) Assignee: Sony Corporation (JP)

( * ) Notice: Subject to any disclaimer, the term of this patent is extended or adjusted under 35 U.S.C. 154(b) by 142 days.

(21) Appl. No.: 10/926,040

(22) Filed: Aug. 26, 2004

(65) Prior Publication Data

US 2005/0046524 A1  Mar. 3, 2005

(30) Foreign Application Priority Data

Aug. 28, 2003  (JP)  ............................ P2003-305166

(51) Int. Cl.
*H01P 3/08* (2006.01)
(52) U.S. Cl. ................. 333/238; 333/243; 333/246; 333/247
(58) Field of Classification Search ............... 333/238, 333/246, 243, 245, 247
See application file for complete search history.

(56) References Cited

U.S. PATENT DOCUMENTS 5,075,655 A * 12/1991 Pond et al. ................. 333/238
5,510,758 A * 4/1996 Fujita et al. ................. 333/247
5,652,557 A * 7/1997 Ishikawa .................... 333/243
5,903,239 A * 5/1999 Takahashi et al. ... 343/700 MS
6,720,245 B2 * 4/2004 Stucchi et al. .............. 438/614

FOREIGN PATENT DOCUMENTS

JP   07-336114 A1   12/1995

* cited by examiner

*Primary Examiner*—Robert Pascal
*Assistant Examiner*—Kimberly E Glenn
(74) *Attorney, Agent, or Firm*—Rader Fishman & Grauer PLLC; Ronald P. Kananen

(57) ABSTRACT

A substrate having a microstrip line structure is provided comprising a trench provided at least in one main surface of a base body constituting the substrate having an inner surface geometry of an unbent curved surface and corresponding to the pattern of the microstrip line; a laminate film having a ground conductive layer and an insulating layer formed along the inner surface geometry of the trench; and a signal line layer constituting the microstrip line formed on the laminate film; where the signal line layer has a configuration separated for each trench.

7 Claims, 13 Drawing Sheets

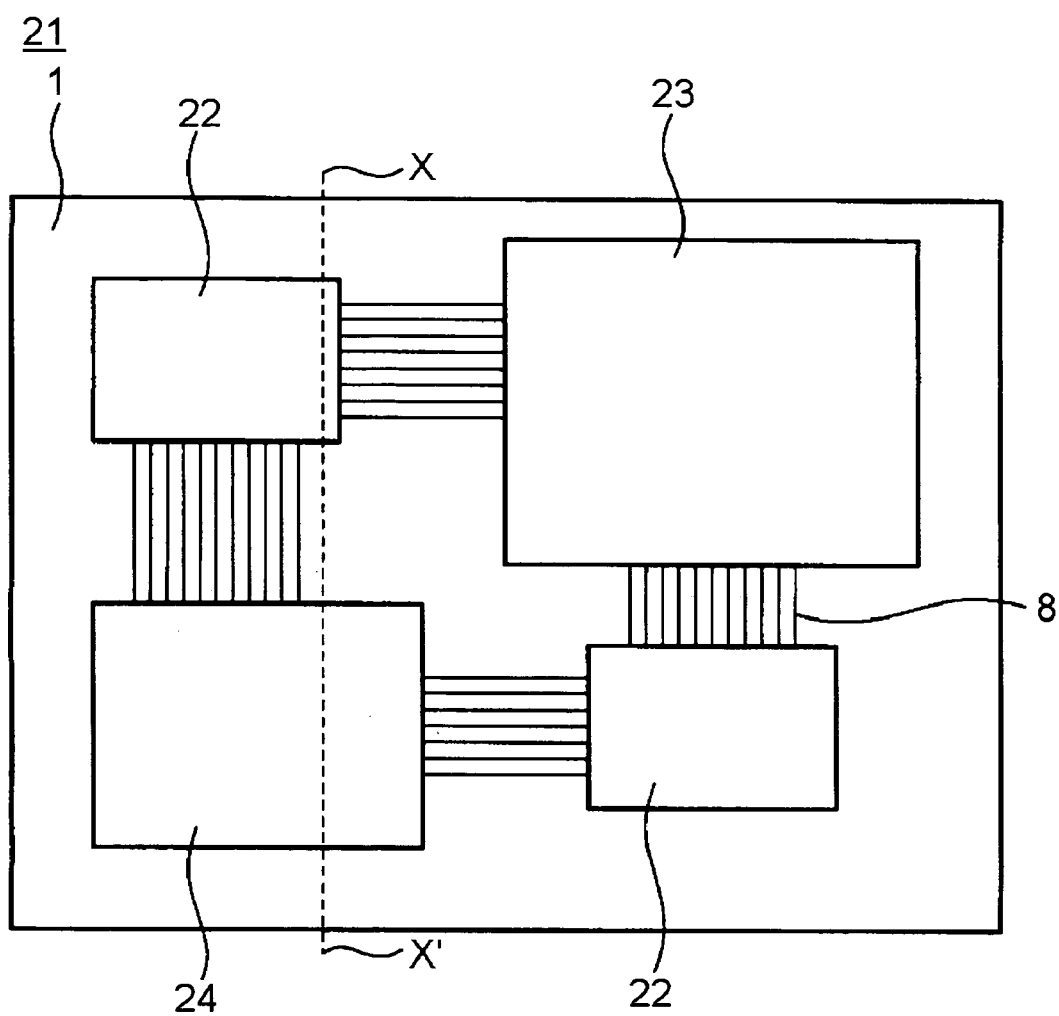

SUBSTRATE HAVING MICROSTRIP LINE STRUCTURE, SEMICONDUCTOR DEVICE HAVING MICROSTRIP LINE STRUCTURE, AND MANUFACTURING METHOD OF SUBSTRATE HAVING MICROSTRIP LINE STRUCTURE

BACKGROUND OF THE INVENTION

1. Field of the Invention

The present invention relates to a substrate having a microstrip line structure composed of a base body that is a semiconductor or an insulator, a semiconductor device having a microstrip line structure, and a manufacturing method of a substrate having a microstrip line structure.

2. Description of Related Art

Conventionally, in the field of semiconductors, the scale down of process technique has been regarded as an important index of product development, and miniaturization, high-level function, and low electric power consumption of large scale integration (LSI) have been realized by process technology similar to a system on a chip (SOC) to integrate a variety of functions on one chip.

In a SOC, however, there are the problems of a short period of product cycle and difficulties in reducing the development cost associated therewith. For the purpose of complementing this, there has been used a technique by means of a multi chip module (MCM) for mounting a wide variety of dies/chips on a single package. Since the technique is able to appropriate directly a developed die/chip in the MCM, there are the merits of a short period of development and a reduction in development cost. In addition, the point of enabling integration of large-capacity flash memories and DRAMs, which has been difficult in a SOC and a problem in the manufacturing process, also can be said to be an advantage of the MCM.

Recently, the difficulties in complying with an increase in mounting a number of parts, which is caused by a deficiency of mounting area and the like, become significant in equipment having a semiconductor device, particularly portable equipment, and the limit of mounting by the SOC is also pointed out.

The solution to this problem shows increasingly the tendency to decrease the mounting area by, for example, a MCM of a stack type in which a plurality of chips are stacked vertically. That is, the understanding of the MCM is changing from one means for complementing a SOC to the main mounting technique in semiconductor technology.

In this MCM, a substrate constituting an interposer having a microstrip line structure is used.

On the other hand, there was proposed the formation of a microstrip line structure on the surface of a substrate composed of silicon (for example, Patent Document 1).

[Patent Document 1]

Japanese Patent Application Publication No. 7-336114 (FIG. 1, paragraph No. "0006").

Meanwhile, in the case of applying voltage to two adjacent conductors, if the voltage is direct current, or even if it is alternating current, but the frequency is low, only the influence due to the resistances possessed by the two conductors is exerted on the mutual conductors and their internal currents. In contrast, if the frequency enters the microwave band in alternating current, the mutual influence occurs even by the electric field caused by the inductance of the conductors themselves and the capacitance between the conductors.

The influence of this problem is further increased by the nature of the microwave, resulting from its frequency height, which flows intensively in the vicinity of the surface of a conductor rather than the inside, which is generally called "skin effect."

Hence, in a substrate having a microstrip line structure, the mutual influence in each wiring is liable to occur than in a general substrate, and as a result, it might interfere even with the overall operation of a semiconductor device having this substrate.

Therefore, in general, when manufacturing a MCM, also in view of the tendency to elongate the wiring of a SOC, if a substrate is one having difficulties in adding an allowance for the distance between respective wiring, such as an interposer, it is desirable to reduce the mutual influence between the respective wiring as much as possible.

In addition, although attempts also have been made to form a wiring part of a microstrip line structure by cutting trenches in a substrate, of which a cross section is a rectangle, the microstrip line structure with this construction suffers from problems due to poor coverage in the interlayer adhesion, such as between an insulating layer and a conductive layer, as well as defects in respective layers and the occurrence of leaks due to the defects.

SUMMARY OF THE INVENTION

An object of the present invention is to solve various problems in substrates having the above-mentioned microstrip line and in semiconductor devices having this substrate as an interposer.

A substrate having a microstrip line structure in accordance with the present invention has, at least in one main surface of a base body constituting a substrate, a trench having an inner surface geometry of an unbent curved surface and corresponding to the pattern of an objective microstrip line pattern, and it is characterized in that a laminate film having a ground conductive layer and an insulating layer is formed along the inner surface geometry of the trench, a signal line layer constituting the microstrip line is formed on the laminate film, and the signal line layer has a construction separated for each trench.

The term "unbent curved surface" may be a curved surface of which the curvature is continuous, and the curvature of the curved surface may not necessarily be constant in the present invention.

In addition, in a substrate having a microstrip line structure in accordance with the present invention, it is able to employ a construction in which the above-mentioned base body is a semiconductor or an insulator, and if the base body is an insulator, it can be formed integrally with a semiconductor.

Moreover, the above-mentioned laminate film can be formed with a plurality of insulating layers.

A semiconductor device having a microstrip line structure in accordance with the present invention has, at least in one main surface of a base body constituting a substrate thereof, a trench having an inner surface geometry of unbent curved surface and corresponding to an objective microstrip line pattern, and it is characterized in that a laminate film having a ground conductive layer and an insulating layer is formed along the inner surface geometry of the trench, a signal line layer constituting the microstrip line is formed on the laminate film, and the signal line layer has a construction separated for each trench.

In addition, in a semiconductor device having a microstrip line structure in accordance with the present invention, it is able to employ a construction in which the above-mentioned base body is a semiconductor or an insulator, and if the base body is an insulator, it can be formed integrally with a semiconductor.

Moreover, the above-mentioned laminate film can be formed with a plurality of insulating layers.

Further, in a semiconductor device having a microstrip line structure in accordance with the present invention, it is able to employ a construction composed of a plurality of substrates, such as a main board substrate and an interposer substrate, and the above-mentioned base body can be a base body constituting at least one of either of the main board substrate or the interposer substrate.

In addition, a manufacturing method of a substrate having a microstrip line structure in accordance with the present invention has a trench forming step of forming, at least in one main surface of a base body constituting a substrate, a trench having an inner surface geometry of an unbent curved surface and corresponding to the pattern of an objective microstrip line pattern, a laminate forming step of forming a laminate film having a ground conductive layer and an insulating layer along the inner surface geometry of this trench, and step of forming a signal line layer on the laminate film, and is characterized by separating a signal line layer for each trench.

In addition, in a substrate having a microstrip line structure in accordance with the present invention, it is able to employ a construction in which the above-mentioned base body is a semiconductor or an insulator, and if the base body is an insulator, it can be formed integrally with a semiconductor.

Moreover, the above-mentioned laminate film can be formed with a plurality of insulating layers.

In a substrate having a microstrip line structure in accordance with the present invention, the fact that the substrate is constituted of a base body of a semiconductor makes it possible to utilize semiconductor manufacturing technology and thus facilitate microfabrication, so that high integration is easily accomplished in a semiconductor device having a microstrip line structure in accordance with the present invention.

In a substrate having a microstrip line structure in accordance with the present invention, it is able to reduce the mutual influence derived from the electric field of each wiring in a plurality of adjacent conductors, by having the structure that a signal line layer is embedded in the substrate and the signal line layer is surrounded by a laminate film consisting of an insulating layer and a ground conductive layer.

This enables fast operation in a semiconductor device having a microstrip line structure in accordance with the present invention.

Further, in a substrate having a microstrip line structure in accordance with the present invention, in the case of using an insulator base body, it is formed integrally with a semiconductor base body. It is therefore able to prevent a decrease in the mechanical and physical strengths of the substrate in a semiconductor device having a microstrip line structure in accordance with the present invention.

In a substrate having a microstrip line structure in accordance with the present invention, the fact that the substrate is constituted of a base body of a semiconductor makes it possible to utilize semiconductor manufacturing technology and thus facilitate microfabrication, so that high integration is easily accomplished in a semiconductor device having a microstrip line structure in accordance with the present invention.

Further, in a substrate having a microstrip line structure in accordance with the present invention, from the fact that it is able to employ the structure in which a ground conductive layer in a plurality of wiring is common, it is unnecessary to individually apply ground potential to the ground conductive layer in each trench.

According to a manufacturing method of a substrate having a microstrip line structure in accordance with the present invention, by having the shape of a trench in which a microstrip line is formed be of a curved surface structure of semi-cylindrical type, for example, an improvement in coverage is attainable, thereby permitting an improvement in the adhesion between respective layers, such as between an insulating layer and a conductive layer. Thus, the construction of the present invention is able to provide many important effects, including the avoidance of an open circuit in respective layers.

BRIEF DESCRIPTION OF THE DRAWINGS

FIG. 9 is a schematic top view of one example of a semiconductor device having a microstrip line structure in accordance with the present invention;

DESCRIPTION OF THE PREFERRED EMBODIMENTS

Figure 1:
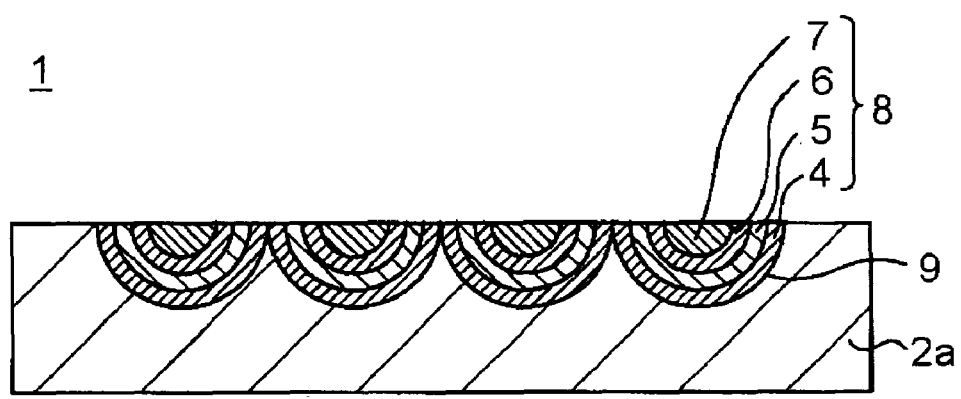
FIG. 1 is a schematic transverse sectional view of one example of a substrate having a microstrip line structure in accordance with the present invention.

Preferred embodiments of a substrate having a microstrip line structure, a semiconductor device having a microstrip line structure, and a manufacturing method of a substrate having a microstrip line structure in accordance with the present invention will be described below. Needless to say, the present invention should not be limited to these preferred embodiments.

First, preferred embodiments of a substrate having a microstrip line structure in accordance with the present invention together with preferred embodiments of a manufacturing method thereof are described by referring to the drawings.

First Preferred Embodiment

Referring to FIG. 1 and FIG. 2, a first preferred embodiment of a substrate having a microstrip line structure in accordance with the present invention are together with a preferred embodiment of a manufacturing method thereof now described.

In this preferred embodiment, a substrate 1 having a microstrip line structure in accordance with the present invention is, for example, as FIG. 1 shows a schematic sectional view thereof, composed of a semiconductor base body 2a, such as a silicon base body constituting a silicon interposer, and has a structure in which wiring 8 having an insulating layer 4, a ground conductive layer 5, an insulating layer 6, and a signal line layer 7 is disposed in a trench 9 that is formed in the semiconductor base body 2a and has a an unbent curved surface of which the cross section is a semicircle.

A preferred embodiment of a manufacturing method of the substrate 1 in this example is described by referring to FIG. 2.

Figure 2A:
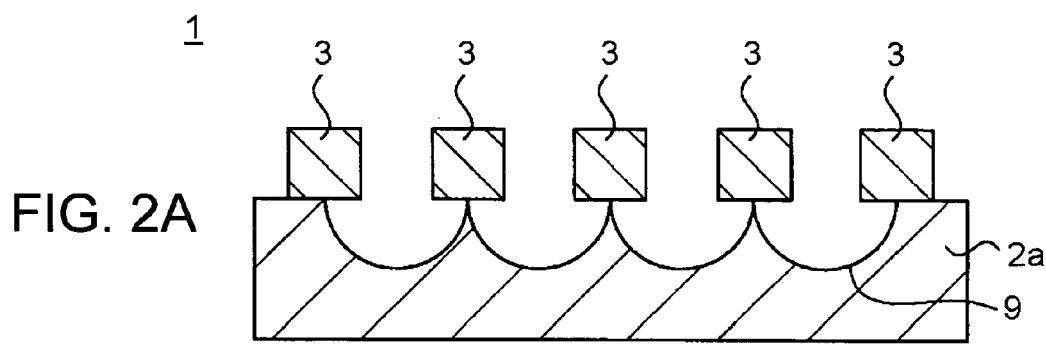
FIG. 2 is a schematic sectional view of one manufacturing step in one example of a substrate having a microstrip line structure in accordance with the present invention.

As shown in FIG. 2A, there is first prepared a semiconductor base body 2a composed of silicon, for example. A resist 3 having an opening corresponding to an objective microstrip line pattern, which serves as an etching mask for trench formation, is formed on one main surface of the semiconductor base body 2a by lithography.

Then, a trench forming step of forming an unbent curved surface trench 9, of which the cross section is of a semi-cylindrical shape, for example, is carried out by isotropic etching with the use of plasma etching, for example, through the opening of the resist 3, in the surface of the semiconductor base body 2a.

Figure 2B:
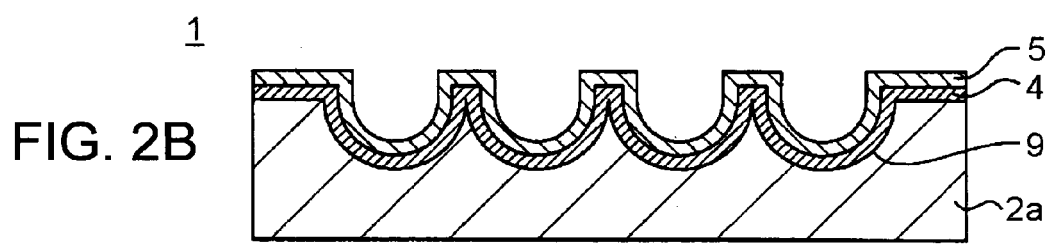

Subsequently, as shown in FIG. 2B, in the inside of the curved surface trench 9 formed by this plasma etching, an insulating layer 4 composed of SiO, for example, is formed along the inner surface geometry of the trench 9 by plasma chemical vapor deposition (CVD) in a thickness of 100 nm, for example. Further, a ground conductive layer 5 composed of AlCu, for example, is formed thereon by sputtering in a thickness of 50 nm, for example.

Thereafter, not shown by a figure, a resist for surface planarization is applied, and the substrate 1 is planarized and polished from the surface by chemical mechanical polishing (CMP), such that the ground conductive layer 5 existing between respective trenches is polished and removed to separate the ground conductive layer 5 in the respective trenches 9. The resist is then removed with a resist stripping agent.

Figure 2C:
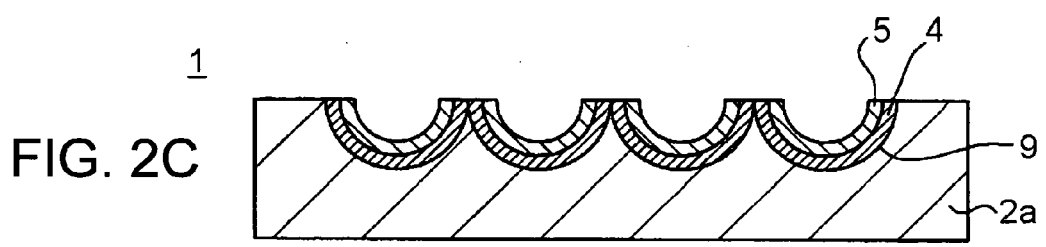

Thereby, as shown in FIG. 2C, the insulating layer 4 and the ground conductive layer 5 are formed only in the inside of a number of the curved surface trenches 9 on the surface of the semiconductor base body 2a.

Subsequently, not shown by a figure, a laminate film forming step is performed in which an insulating layer 6 is formed by plasma CVD in a thickness of 100 nm, for example, so as to be continuous with the insulating layer 4 and the ground conductive layer 5 in the inside of a number of the curved surface trenches 9 on the surface of the semiconductor base body 2a, thereby forming a laminate film consisting of the ground conductive layer 5 and the insulating layer 6.

Thereafter, the step of separating the wiring 8 in the respective trenches 9 from each other, as shown in FIG. 1, is performed by forming a signal line layer 7 composed of AlCu, for example, over the entire surface by sputtering, and similarly performing the application of resist for planarization and CMP processing. Thus, the substrate 1 having a microstrip line structure in accordance with the present invention is manufactured.

Second Preferred Embodiment

A second preferred embodiment of a substrate having a microstrip line structure in accordance with the present invention together with a preferred embodiment of a manufacturing method thereof will next be described. by referring to FIG. 3 and FIG. 4.

Figure 3:
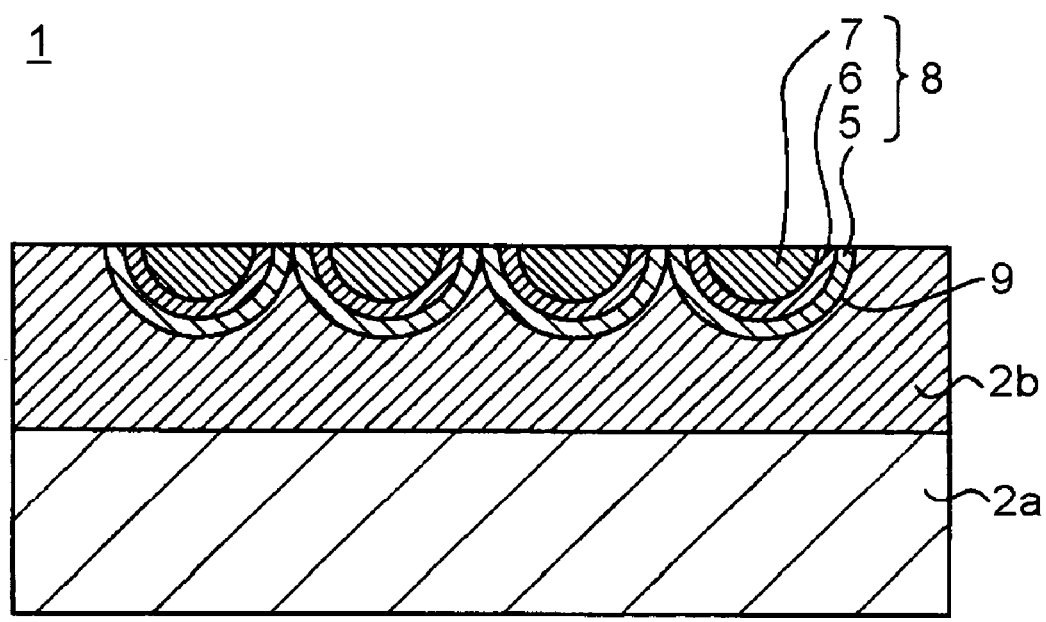
FIG. 3 is a schematic transverse sectional view of one example of a substrate having a microstrip line structure in accordance with the present invention.

In FIG. 3 and FIG. 4, components in common with FIG. 1 and FIG. 2 are represented by the same numbers, in order to avoid an overlapping description.

In this preferred embodiment, a substrate 1 having a microstrip line structure in accordance with the present invention is, for example, as FIG. 3 shows a schematic sectional view thereof, composed of a semiconductor base body 2a and an insulator base body 2b, and has a structure in which wiring 8 consisting of a ground conductive layer 5, an insulating layer 6, and a signal line layer 7 is disposed in a trench 9 that is formed in the insulator base body 2b and has a non-bended curved surface of which a cross section is a semicircle.

A preferred embodiment of a manufacturing method of the substrate 1 in this example is now described by referring to FIG. 4.

Figure 4A:
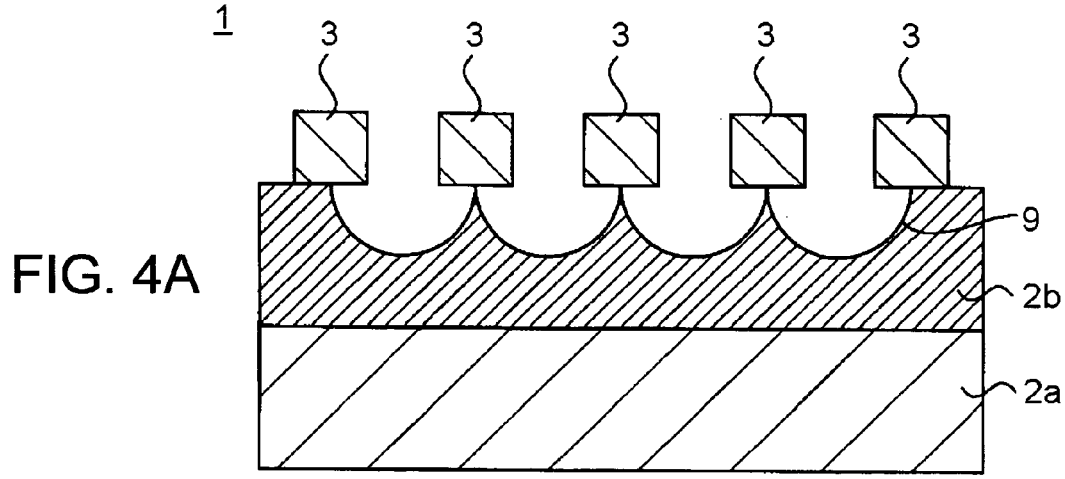
FIG. 4 is a schematic sectional view of one manufacturing step in one example of a substrate having a microstrip line structure in accordance with the present invention.

As shown in FIG. 4A, there is first prepared a semiconductor base body 2a composed of silicon, for example. Then, an insulator base body 2b that is composed of SiO and has a low dielectric constant is formed by CVD, for example, on one main surface of the semiconductor base body 2a, for example. Thereafter, a resist 3, which serves as an etching mask for forming a trench that has an opening corresponding to an objective microstrip line pattern, is formed by lithography technology on one main surface of the insulator base body 2b, for example.

Then, a trench forming step of forming an unbent curved surface trench 9, of which the cross section is of a semi-cylindrical shape, is carried out by performing isotropic etching with the use of plasma etching, for example, through the opening of the resist 3, in the surface of the insulator base body 2b.

Figure 4B:
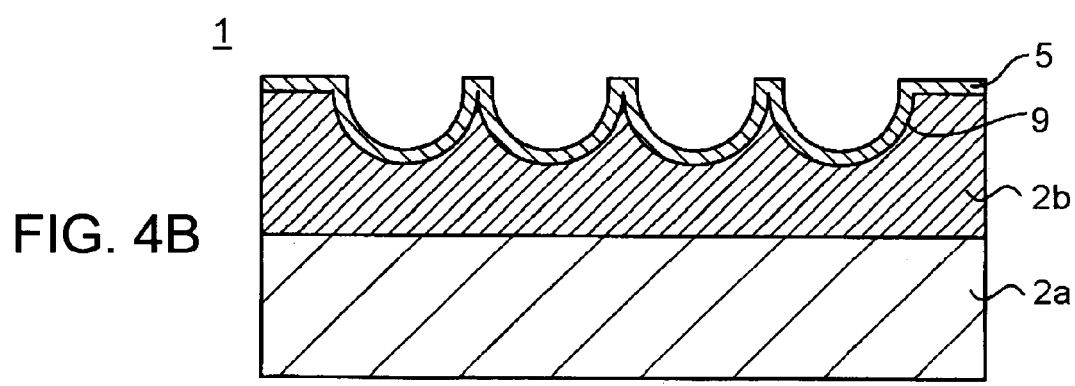

Subsequently, as shown in FIG. 4B, in the inside of the curved surface trench 9 formed by this plasma etching, a ground conductive layer 5 composed of AlCu, for example, is formed by spluttering in a thickness of 50 nm, for example.

Figure 4C:
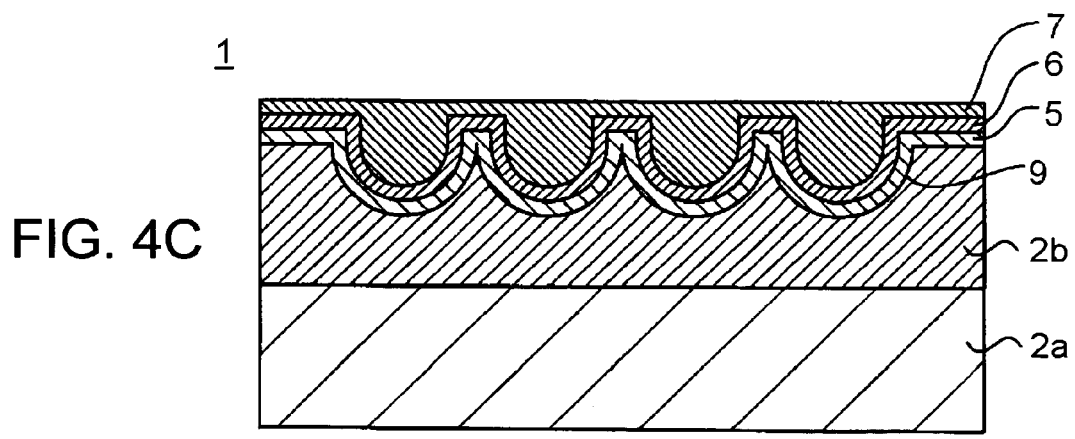

Subsequently, as shown in FIG. 4C, a laminate film forming step is performed in which an insulating layer 6 is formed by plasma CVD in a thickness of 100 nm, for example, along the inner surface geometry of the trench, so as to be continuous with the ground conductive layer 5 in the inside of a number of the curved surface trenches 9 on the surface of the insulator base body 2b, thereby forming a laminate film consisting of the ground conductive layer 5 and the insulating layer 6.

Thereafter, a signal line layer 7 composed of AlCu, for example, is formed over the entire surface by sputtering.

Thereafter, a resist for surface planarization is applied (not shown), and the substrate 1 is planarized and polished from the surface by CMP, such that the ground conductive layer 5 and the signal line layer 7 existing between respective trenches are polished and removed to separate the ground wiring layer 5 and the signal line layer 7 in the respective trenches. The resist is then removed with a resist stripping agent. Thereby, the step of separating the wiring 8 in the respective trenches 9 from each other is performed, as shown in FIG. 3. Thus, the substrate 1 having a microstrip line structure in accordance with the present invention is manufactured.

Third Preferred Embodiment

Figure 5:
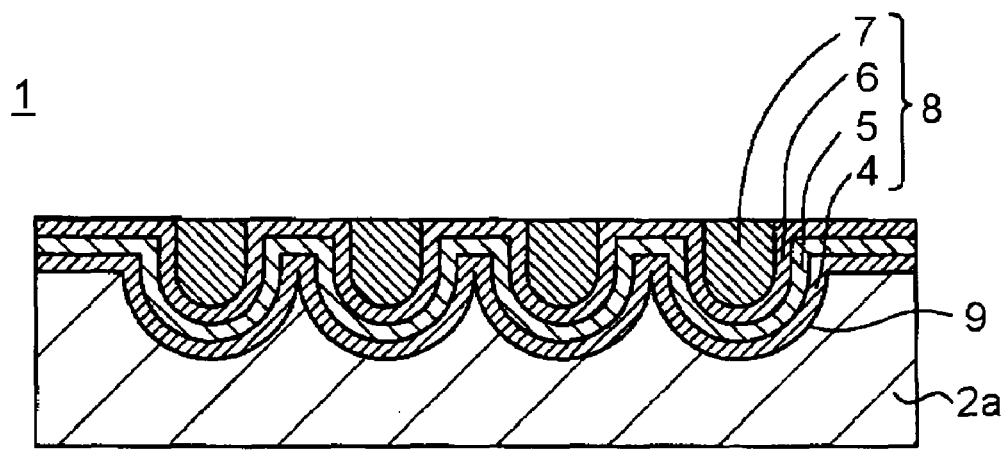
FIG. 5 is a schematic transverse sectional view of one example of a substrate having a microstrip line structure in accordance with the present invention.

In this preferred embodiment, a substrate 1 having a microstrip line structure in accordance with the present invention is, for example, as FIG. 5 shows a schematic sectional view thereof, composed of a semiconductor base body 2a, such as a silicon base body constituting a silicon interposer, and has a structure in which wiring 8 having an insulating layer 4, a ground conductive layer 5, an insulating layer 6, and a signal line layer 7 is disposed in a trench 9 that is formed in the semiconductor base body 2a and has a non-bended curved surface of which a cross section is a semicircle.

Although the foregoing first preferred embodiment describes the case where the ground conductive layer 5 between the respective trenches 9 is separated from each other, this ground conductive layer 5 can be of a structure in which it is connected to each other, as described in the third preferred embodiment.

Figure 6A:
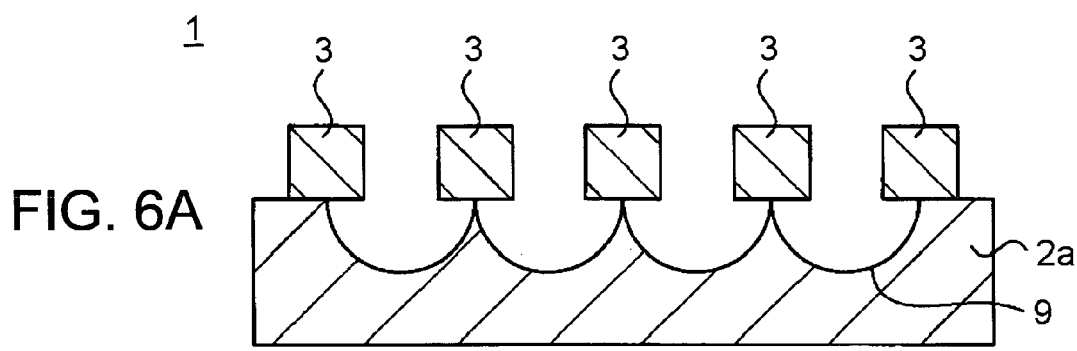
FIG. 6 is a schematic sectional view of one manufacturing step in one example of a substrate having a microstrip line structure in accordance with the present invention.
Figure 6B:
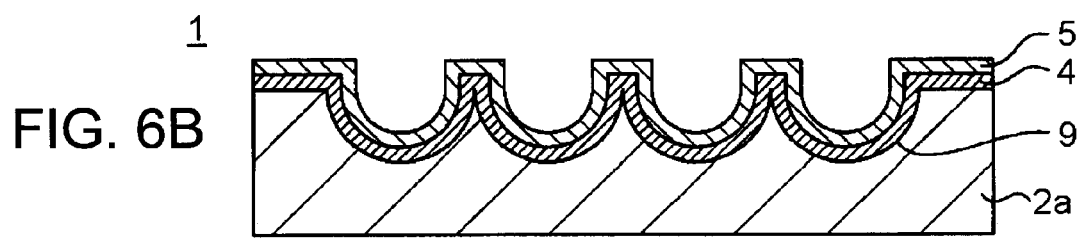
Figure 6C:
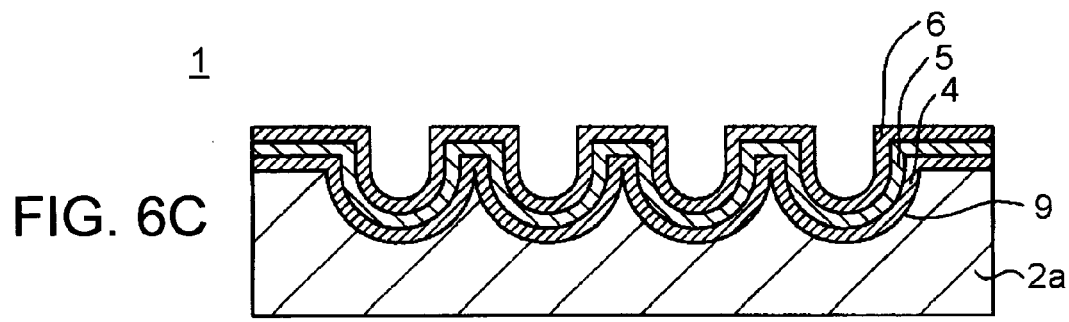

A preferred embodiment of a manufacturing method of the substrate 1 in this example is now described by referring to FIG. 6.

As shown in FIG. 6A, there is first prepared a semiconductor base body 2a composed of silicon, for example. A resist 3, which serves as an etching mask for trench formation, is formed on one main surface of the semiconductor base body 2a by lithography.

Then, a trench forming step of forming an unbent curved surface trench 9, of which the cross section is of a semicylindrical shape, is carried out by performing isotropic etching with use of plasma etching, for example, through the opening of the resist 3, in the surface of the semiconductor base body 2a.

Subsequently, as shown in FIG. 6B, in the inside of the curved surface trench 9 formed by this plasma etching, an insulating layer 4 composed of SiO, for example, is formed along the inner surface geometry of this trench 9 by plasma chemical vapor deposition (CVD) in a thickness of 100 nm, for example. Further, a ground conductive layer 5 composed of AlCu, for example, is formed thereon by sputtering in a thickness of 50 nm, for example.

Subsequently, not shown by a figure, a laminate film forming step is performed in which an insulating layer 6 is formed by plasma CVD, for example, in a thickness of 100 nm, for example, so as to be continuous with the insulating layer 4 and the ground conductive layer 5 in the inside of a number of the curved surface trenches 9 in the surface of the semiconductor base body 2a, thereby forming a laminate film consisting of the ground conductive layer 5 and the insulating layer 6.

Thereafter, the step of separating a signal line layer 7 in the respective trenches 9 from each other, as shown in FIG. 5, is performed by forming the signal line layer 7 composed of AlCu, for example, over the entire surface by sputtering, and applying a resist for planarization and CMP processing. Thus, the substrate 1 having a microstrip line structure in accordance with the present invention is manufactured.

Fourth Preferred Embodiment

Figure 7:
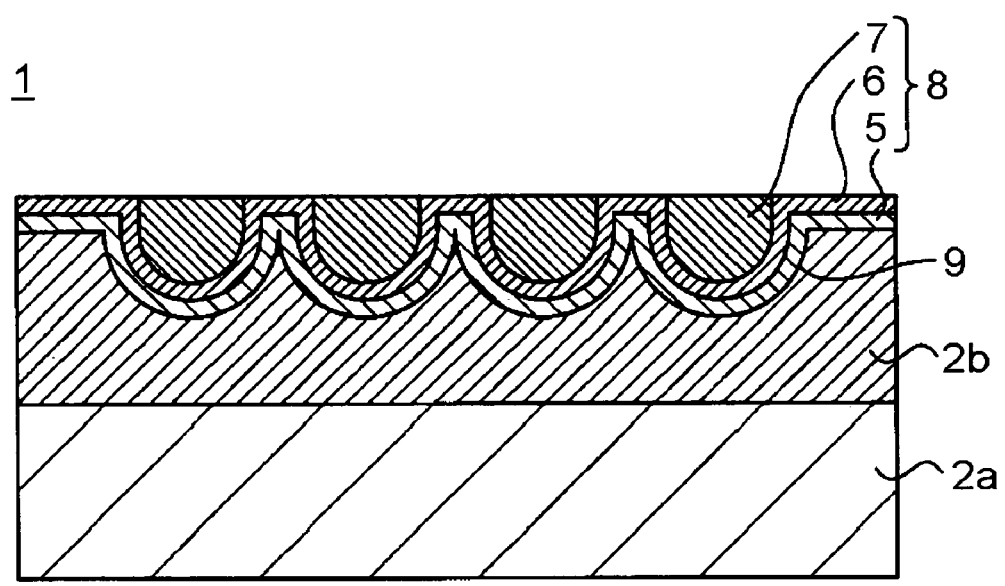
FIG. 7 is a schematic transverse sectional view of one example of a substrate having a microstrip line structure in accordance with the present invention.

In this preferred embodiment, a substrate 1 having a microstrip line structure in accordance with the present invention is, for example, as FIG. 7 shows a schematic sectional view thereof, composed of a semiconductor base body 2a and an insulator base body 2b, and has a structure in which wiring 8 consisting of a ground conductive layer 5, an insulating layer 6, and a signal line layer 7 is disposed in a trench 9 that is formed in the insulator base body 2b and has an unbent curved surface of which the cross section is a semicircle.

A preferred embodiment of a manufacturing method of the substrate 1 in this example is now described by referring to FIG. 8.

Figure 8A:
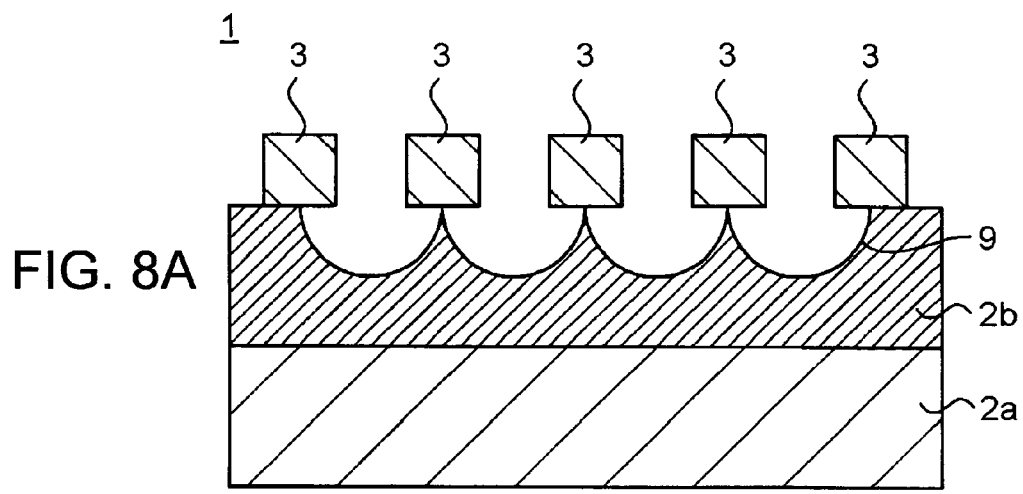
FIG. 8 is a schematic sectional view of one manufacturing step in one example of a substrate having a microstrip line structure in accordance with the present invention.

As shown in FIG. 8A, there is first prepared a semiconductor base body 2a composed of silicon, for example. Then, an insulator base body 2b that is composed of SiO and has a low dielectric constant is formed by CVD, for example, on one main surface of the insulator base body 2b, for example. Thereafter, a resist 3, which serves as an etching mask for forming a trench that has an opening corresponding to an objective microstrip line pattern, is formed by lithography technology on one main surface of the insulator base body 2b, for example.

Then, a trench forming step of forming an unbent curved surface trench 9, of which the cross section is of semi-cylindrical shape, is carried out by performing isotropic etching with the use of plasma etching, for example, through the opening of the resist 3, in the surface of the insulator base body 2b.

Figure 8B:
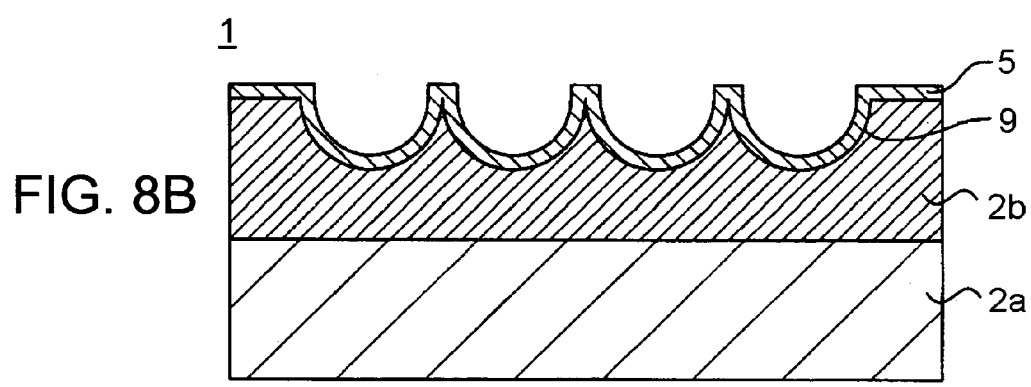

Subsequently, as shown in FIG. 8B, in the inside of the curved surface trench 9 formed by this plasma etching, a ground conductive layer 5 composed of AlCu, for example, is formed by spluttering in a thickness of 50 nm, for example.

Figure 8C:
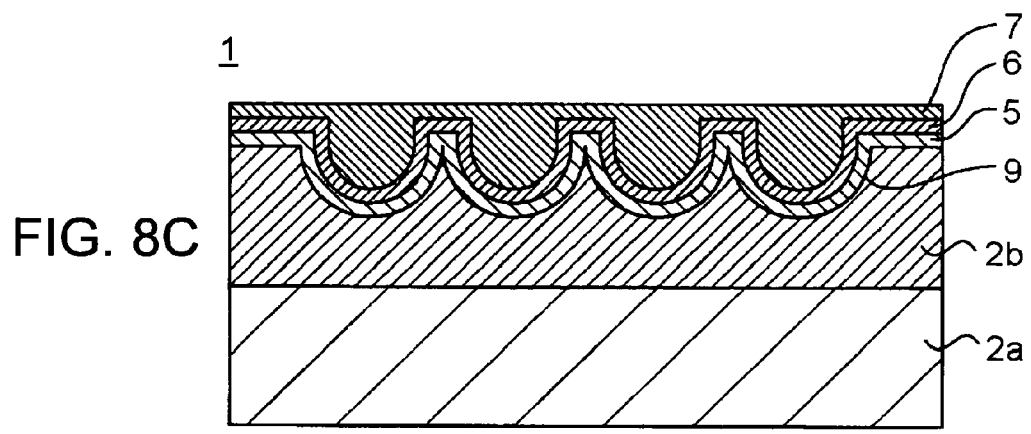

Subsequently, as shown in FIG. 8C, a laminate film forming step is performed in which an insulating layer 6 is formed by plasma CVD in a thickness of 100 nm, for example, along the inner surface geometry of the trench, so as to be continuous with the ground conductive layer 5 in the inside of a number of the curved surface trenches 9 in the surface of the insulator base body 2b, thereby forming a laminate film consisting of the ground conductive layer 5 and the insulating layer 6.

Thereafter, a signal line layer 7 composed of AlCu, for example, is formed over the entire surface by sputtering.

Thereafter, a resist for surface planarization is applied (not shown), and the substrate 1 is planarized and polished from the surface by CMP, such that the signal line layer 7 existing between respective trenches is polished and removed to separate the signal line layer 7 in the respective trenches. The resist is then removed with a resist stripping agent. Thereby, the step of separating the signal line layer 7 in the respective trenches 9 from each other is performed, as shown in FIG. 7. Thus, the substrate 1 having a microstrip line structure in accordance with the present invention is manufactured.

Alternatively, in the substrate having the microstrip line structure in accordance with the present invention, respective steps, including CMP, can be performed suitably in response to the step and the contents of an objective substrate configuration.

Preferred embodiments of a semiconductor device having a microstrip line structure, which comprises a substrate having the above-mentioned microstrip line structure, will be described next by referring to FIG. 9 to FIG. 11.

A semiconductor device 21 having this microstrip line structure has, as FIG. 9 shows a schematic block diagram thereof, a substrate 1 having a microstrip line structure, and also has a plurality of semiconductor chips, such as an internal storage device 22 generally called memory, a central processing unit (CPU) 23, and a radio frequency (RF) circuit 24.

The internal storage device 22 and the CPU 23 and the RF circuit 24 are electrically connected to each other by wiring 8 with the microstrip line structure formed in the substrate 1.

Even in a semiconductor device that has a multi-layer wiring structure and uses the substrate 1 in the semiconductor device 21 in accordance with the present invention, as the above-mentioned silicon interposer, for example, it is able to employ a construction having a microstrip line structure.

First and second preferred embodiments of the formation and the structure of the semiconductor device having the microstrip line structure in accordance with the present invention together with a manufacturing method thereof will be described by referring to FIG. 10 and FIG. 11.

[First Preferred Embodiment of the Semiconductor Device]

Figure 10A:
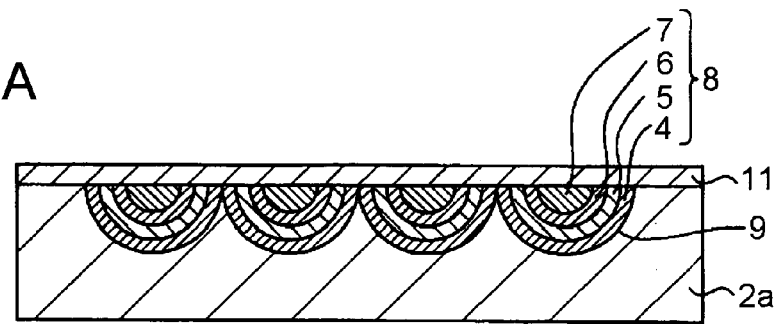
FIG. 10 is a schematic sectional view showing the structure of one example of a semiconductor device having a microstrip line structure in accordance with the present invention.

In this preferred embodiment, as shown in FIG. 10A, a protective coat 11 composed of SiN is first formed on the surface of a substrate having a microstrip line structure in accordance with the present invention, over the entire surface thereof by plasma CVD, for example.

In this case, for example, in the substrate 1 having the microstrip line structure as described in FIG. 1, a so-called pad portion 8a of wide section, which is formed concurrently with wiring 8, is formed at a predetermined portion of the wiring 8, as shown in FIG. 6B. In this structure, on the pad portion 8a of the protective coat 11, an opening 11a for bump formation is opened in the protective coat 11. Through this opening 11a, a barrier metal layer composed of a Ti/Cu system, for example, namely a first bump forming layer 12, is formed by sputtering, and a second bump forming layer 13 composed of Ni, for example, is formed by plating.

Figure 10B:
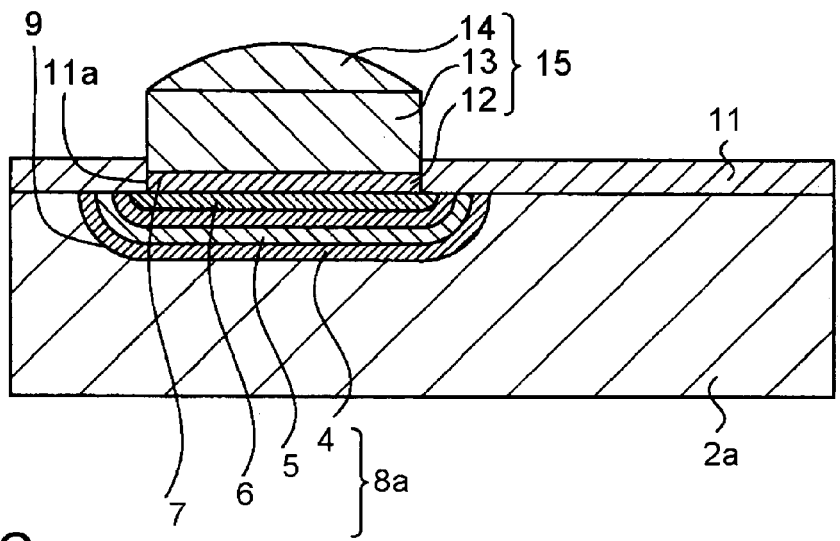

Thereafter, on the second bump forming layer 13, a third bump forming layer 14 composed of a Sn/Ag system, for example, is formed by plating, and a shoulder portion of the third bump forming layer 14 is brought into a gentle convex by reflow, thereby forming a bump 15, as shown in FIG. 10B.

Figure 10C:
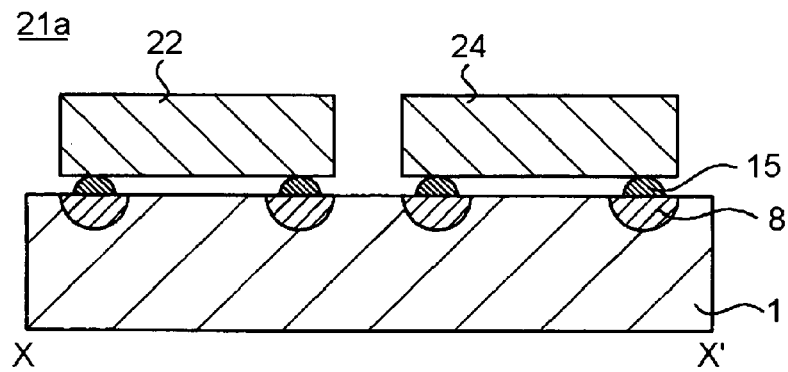

Then, as shown in FIG. 10C, which is a schematic sectional view taken along the line X-X' in FIG. 9, an internal storage device 22 or a high-frequency RF circuit 24 is disposed via the wiring 8 and the bump 15 on the substrate 1, thereby forming a main portion of the semiconductor device 21a.

[Second Preferred Embodiment of the Semiconductor Device]

Figure 11A:
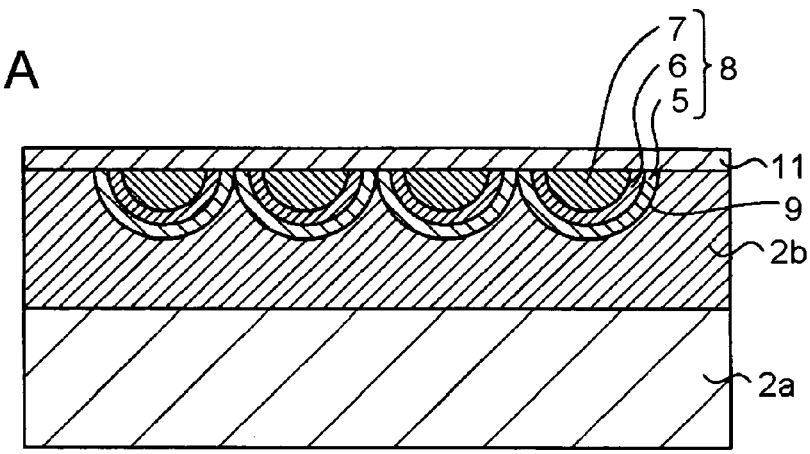
FIG. 11 is a schematic sectional view showing the structure of one example of a semiconductor device having a microstrip line structure in accordance with the present invention.

In this preferred embodiment, as shown in FIG. 11A, a protective coat 11 composed of SiN is first formed on the surface of a substrate having a microstrip line structure in accordance with the present invention, over the entire surface thereof by plasma CVD, for example.

In this case, for example, in the substrate 1 having the microstrip line structure as described in FIG. 3, a so-called pad portion 8a of wide section, which is formed concurrently with wiring 8, is formed at a predetermined portion of the wiring 8, as shown in FIG. 7B.

In this structure, on the pad portion 8a of the protective coat 11, an opening 11a for bump formation is opened in the protective coat 11. Through this opening 11a, a barrier metal layer composed of a Ti/Cu system, for example, namely a first bump forming layer 12, is formed by sputtering, and a second bump forming layer 13 composed of Ni, for example, is formed by plating.

Figure 11B:
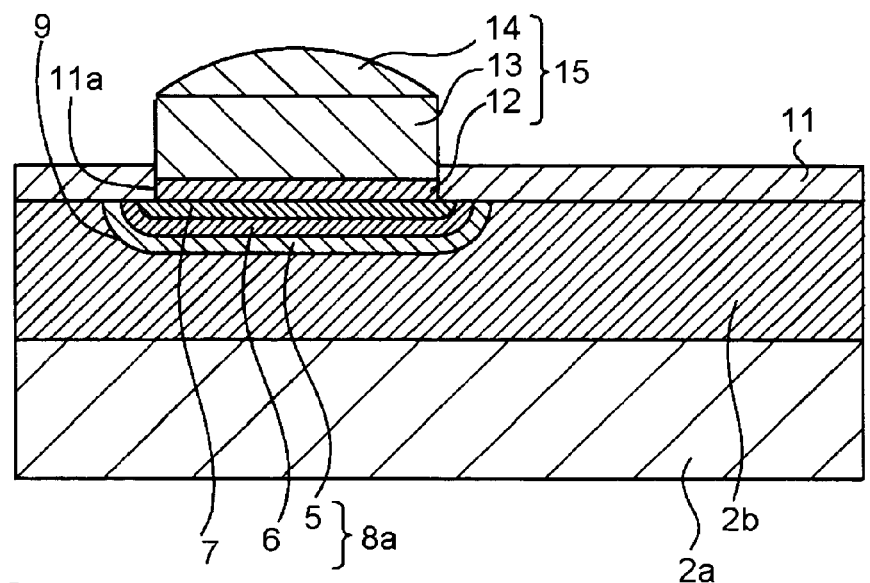
Figure 11C:
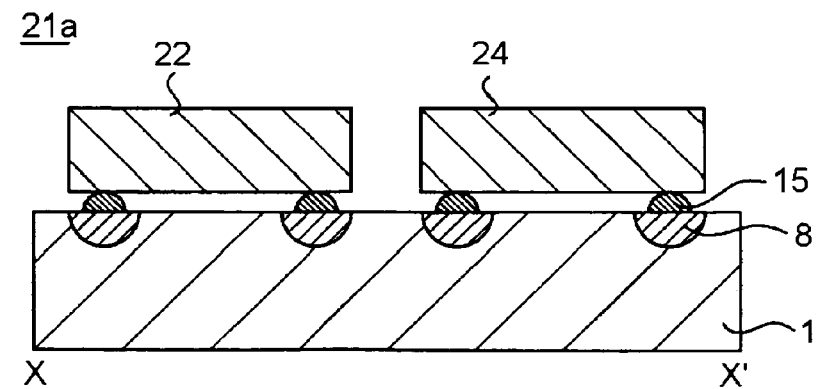

Thereafter, on the second bump forming layer 13, a third bump forming layer 14 composed of a Sn/Ag system, for example, is formed by plating, and a shoulder portion of the third bump forming layer 14 is brought into a gentle convex by reflow, thereby forming a bump 15, as shown in FIG. 11B.

Then, as shown in FIG. 1C, which is a schematic sectional view taken along the line X-X' in FIG. 9, an internal storage device 22 or a high-frequency RF circuit 24 is disposed via the wiring 8 and the bump 15 on the substrate 1, thereby forming the semiconductor device 21.

While the preferred embodiments of the semiconductor device having the microstrip line structure in accordance with the present invention have been described above. Needless to say, the semiconductor device having the microstrip line structure in accordance with the present invention should not be limited by these preferred embodiments, and various changes and modifications can be made to it.

Figure 12:
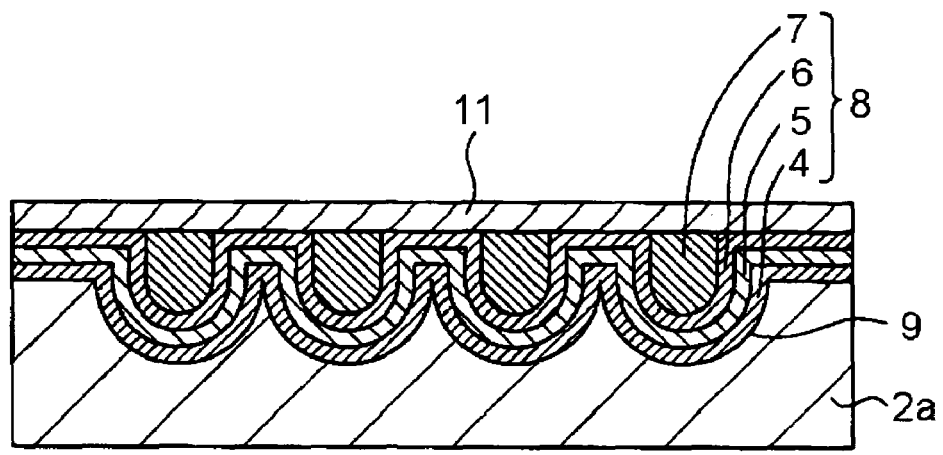
FIG. 12 is a schematic sectional view in one manufacturing step of one example of a semiconductor device having a microstrip line structure in accordance with the present invention.
Figure 13:
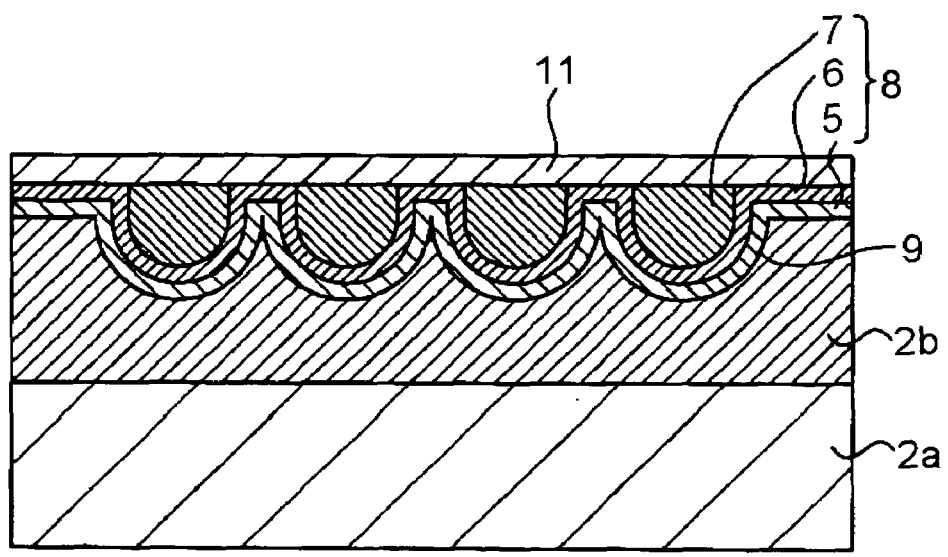
FIG. 13 is a schematic sectional view in one manufacturing step of one example of a semiconductor device having a microstrip line structure in accordance with the present invention.

For example, it is also able to obtain semiconductor devices constructed, as their schematic sectional views are shown in FIG. 12 and FIG. 13, by forming a protective coat 11 composed of SiN by plasma CVD, for example, on the substrate surface of the substrate 1 in the third and fourth preferred embodiments of a substrate having a microstrip line structure, that is, the substrate 1 having the structure in which the ground conductive layer 5 in the respective trenches 9 is connected to each other, which is shown in FIG. 5 and FIG. 7.

Additionally, needless to say, the substrate having a microstrip line structure and the manufacturing method of the substrate having a microstrip line structure in accordance with the present invention are not limited to this preferred embodiment, and various changes and modifications can be made to it.

For example, in the substrate having a microstrip line structure in accordance with the present invention, the shape of the trench formed in the semiconductor base body 2a or the insulator base body 2b is not necessarily limited to a curved surface of which curvature is constant, but it may be an unbent curved surface of an oval or ellipsoidal shape, of which the curvature changes continuously.

Additionally, the laminate film consisting of the ground conductive layer and the insulating layer can be of a construction having a plurality of insulating layers, in response to applications and needs.

Figure 14A:
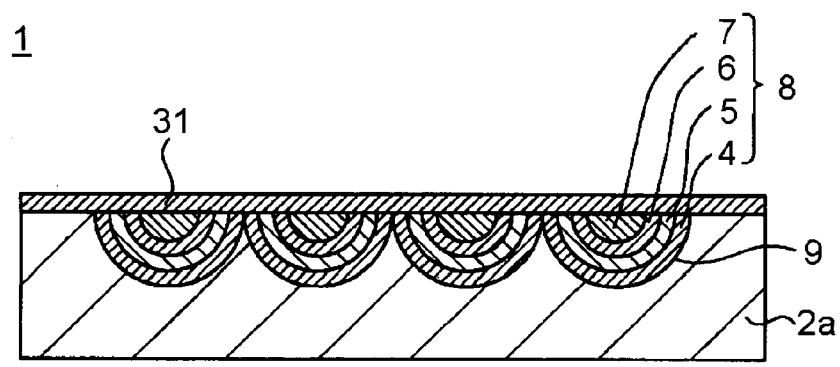
FIG. 14 is a schematic transverse sectional view of one example of a substrate having a microstrip line structure in accordance with the present invention.
Figure 14B:
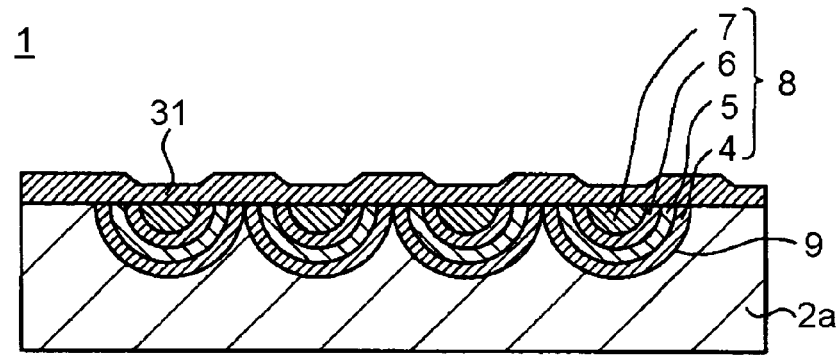

For example, as shown in FIG. 14A and FIG. 14B, in a substrate having a microstrip line structure, it is able to have a construction in which an insulating layer 31 is disposed over the entire surface on the substrate in a desired thickness and a desired shape, in addition to the insulating layer 4 and the insulator layer 6.

What is claimed is:

1. A substrate having a microstrip line structure, comprising:
- a plurality of longitudinally-extending trenches formed into at least one main surface of a base body constituting said substrate and disposed in a juxtaposed manner relative to each other as viewed in cross-section, each one of the plurality of trenches having an arcuate inner surface geometry as viewed in cross-section;
- a laminate film having a ground conductive layer and an insulating layer formed along and entirely covering the inner surface geometry of each one of said plurality of trenches; and
- a plurality of rectilinearly-extending signal line layers, each one of the plurality of signal line layers constituting said microstrip line formed into a respective one of said laminate films;
- wherein respective ones of said signal line layers are separated from one another by adjacent, contiguous ones of the laminate films,
- wherein said base body is an insulator, and
- wherein said base body is formed integrally with a semiconductor.

2. A substrate having a microstrip line structure, comprising:
- a plurality of longitudinally-extending trenches formed into at least one main surface of a base body constituting said substrate and disposed in a juxtaposed manner relative to each other as viewed in cross-section, each one of the plurality of trenches having an arcuate inner surface geometry as viewed in cross-section;
- a laminate film having a ground conductive layer and an insulating layer formed along and entirely covering the inner surface geometry of each one of said plurality of trenches; and
- a plurality of rectilinearly-extending signal line layers each one of the plurality of signal line layers constituting said microstrip line formed into a respective one of said laminate films;
- wherein respective ones of said signal line layers are separated from one another by adjacent, contiguous ones of the laminate films, and
- wherein said laminate film is formed with a plurality of insulating layers.

3. A semiconductor device having a microstrip line structure, comprising:
- a plurality of longitudinally-extending trenches formed into at least one main surface of a base body constituting said substrate and disposed in a juxtaposed manner relative to each other as viewed in cross-section, each one of the plurality of trenches having an arcuate inner surface geometry as viewed in cross-section;
- a laminate film having a ground conductive layer and an insulating layer formed along and entirely covering the inner surface geometry of each one of said plurality of trenches; and
- a plurality of rectilinearly-extending signal line layers, each one of the plurality of signal line layers constituting said microstrip line formed into a respective one said laminate films;
- wherein respective ones of said signal line layer layers are separated from one another by adjacent, contiguous ones of the laminate films,
- a bump is formed on said microstrip line, and
- a semiconductor chip is mounted on said bump,
- wherein said base body is an insulator, and
- wherein said base body is formed integrally with a semiconductor.

4. A semiconductor device having a microstrip line structure, comprising:
- a plurality of longitudinally-extending trenches formed into at least one main surface of a base body constituting said substrate and disposed in a juxtaposed manner relative to each other as viewed in cross-section, each one of the plurality of trenches having an arcuate inner surface geometry as viewed in cross-section;
- a laminate film having a ground conductive layer and an insulating layer formed along and entirely covering the inner surface geometry of each one of said plurality of trenches; and
- a plurality of rectilinearly-extending signal line layers, each one of the plurality of signal line layers constituting said microstrip line formed into a respective one said laminate films;
- wherein respective ones of said signal line layer layers are separated from one another by adjacent, contiguous ones of the laminate films,
- a bump is formed on said microstrip line, and
- a semiconductor chip is mounted on said bump, and
- wherein said laminate film is formed with a plurality of insulating layers.

5. A semiconductor device having a microstrip line structure comprising:
- a plurality of longitudinally-extending trenches formed into at least one main surface of a base body constituting said substrate and disposed in a juxtaposed manner relative to each other as viewed in cross-section, each one of the plurality of trenches having an arcuate inner surface geometry as viewed in cross-section;
- a laminate film having a ground conductive layer and an insulating layer formed along and entirely covering the inner surface geometry of each one of said plurality of trenches; and
- a plurality of rectilinearly-extending signal line layers, each one of the plurality of signal line layers constituting said microstrip line formed into a respective one said laminate films;
- wherein respective ones of said signal line layer layers are separated from one another by adjacent, contiguous ones of the laminate films,
- a bump is formed on said microstrip line, and
- a semiconductor chip is mounted on said bump, and
- wherein said semiconductor device is composed of a main board substrate and an interposer substrate, and the said base body is a base body constituting at least one of either of said main board substrate or said interposer substrate.

6. A method for manufacturing a substrate having a microstrip line, said method comprising the steps of:
- a trench forming step of forming, at least in one main surface of a base body constituting said substrate, a plurality of longitudinally-extending trenches disposed in a juxtaposed manner relative to each other as viewed in cross-section, each one of the plurality of trenches having an arcuate inner surface geometry as viewed in cross-section;

a laminate forming step of forming a laminate film having a ground conductive layer and an insulating layer along the inner surface geometry of each one of said plurality of trenches;
a step of forming a signal line layer on said laminate film of each one of the plurality of trenches;
a step of forming a bump on said microstrip line; and
a step of mounting a semiconductor chip on said bump,
wherein respective ones of said signal line layers are separated from one another by adjacent, contiguous ones of the laminate films,
wherein said base body is an insulator, and
wherein said base body is formed integrally with a semiconductor.

7. A method for manufacturing a substrate having a microstrip line, said method comprising the steps of:
a trench forming step of forming, at least in one main surface of a base body constituting said substrate, a plurality of longitudinally-extending trenches disposed in a juxtaposed manner relative to each other as viewed in cross-section, each one of the plurality of trenches having an arcuate inner surface geometry as viewed in cross-section;
a laminate forming step of forming a laminate film having a ground conductive layer and an insulating layer along the inner surface geometry of each one of said plurality of trenches;
a step of forming a signal line layer on said laminate film of each one of the plurality of trenches;
a step of forming a bump on said microstrip line; and
a step of mounting a semiconductor chip on said bump,
wherein respective ones of said signal line layers are separated from one another by adjacent, contiguous ones of the laminate films, and
wherein said laminate film is formed with a plurality of insulating layers.

* * * * *

UNITED STATES PATENT AND TRADEMARK OFFICE
CERTIFICATE OF CORRECTION

PATENT NO.       : 7,259,644 B2
APPLICATION NO.  : 10/926040
DATED            : August 21, 2007
INVENTOR(S)      : Naoto Sasaki Page 1 of 1

It is certified that error appears in the above-identified patent and that said Letters Patent is hereby corrected as shown below:

Column 11, Line 38:
"layers" should read -- layers, --.

Column 11, Line 64:
"layer" should be deleted.

Column 12, Line 23:
"layer" should be deleted.

Column 12, Line 48:
"layer" should be deleted.

Signed and Sealed this

Thirteenth Day of November, 2007

JON W. DUDAS
*Director of the United States Patent and Trademark Office*